(12) United States Patent
Morikazu et al.

(10) Patent No.: US 7,408,129 B2
(45) Date of Patent: Aug. 5, 2008

(54) LASER BEAM MACHINE WITH CYLINDRICAL LENS SYSTEM

(75) Inventors: Hiroshi Morikazu, Tokyo (JP); Toshio Tsuchiya, Tokyo (JP); Tomoaki Endo, Tokyo (JP); Koichi Takeyama, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/593,045

(22) Filed: Nov. 6, 2006

(65) Prior Publication Data

US 2007/0109526 A1 May 17, 2007

(30) Foreign Application Priority Data

Nov. 16, 2005 (JP) ............... 2005-331118

(51) Int. Cl.
*B23K 26/06* (2006.01)
*G02B 7/02* (2006.01)

(52) U.S. Cl. .................................. 219/121.75
(58) Field of Classification Search ............ 219/121.75, 219/121.73; 359/808, 813
See application file for complete search history.

(56) References Cited

U.S. PATENT DOCUMENTS 4,832,452 A * 5/1989 Eisler .................. 359/813

2004/0017619 A1 * 1/2004 Kang .................. 359/813
2005/0133485 A1 * 6/2005 Tokura ................ 219/121.75

FOREIGN PATENT DOCUMENTS

| JP | 3-13290 | A | * | 1/1991 |
| JP | 7-68392 | A | * | 3/1995 |
| JP | 2003-80389 | A | * | 3/2003 |
| JP | 2004-9139 | | | 1/2004 |
| JP | 2006-116570 | A | * | 5/2006 |

* cited by examiner

*Primary Examiner*—Geoffrey S Evans
(74) *Attorney, Agent, or Firm*—Smith, Gambrell & Russell, LLP

(57) ABSTRACT

A laser beam processing machine comprising a chuck table for holding a workpiece and a laser beam application means for applying a laser beam to the workpiece held on the chuck table, the laser beam application means comprising a laser beam oscillation means for oscillating a laser beam and a condenser for converging the laser beam oscillated by the laser beam oscillation means, wherein the condenser comprises a first cylindrical lens unit having a first cylindrical lens, a second cylindrical lens unit having a second cylindrical lens which is positioned such that its converging direction becomes perpendicular to the converging direction of the first cylindrical lens, and an interval adjustment mechanism for adjusting the interval between the first cylindrical lens unit and the second cylindrical lens unit.

11 Claims, 10 Drawing Sheets

(a)

(b)

LASER BEAM MACHINE WITH CYLINDRICAL LENS SYSTEM

FIELD OF THE INVENTION

The present invention relates to a laser beam processing machine for carrying out laser processing of a workpiece such as a semiconductor wafer and, more specifically, to a laser beam processing machine capable of adjusting the focal spot shape of a laser beam.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas in each of which the device is formed. An optical device wafer having light receiving devices such as photodiodes or light emitting devices such as laser diodes laminated on the front surface of a sapphire substrate is also cut along streets to be divided into individual optical devices such as photodiodes or laser diodes which are widely used in electric appliances.

As a means of dividing a wafer such as the above semiconductor wafer or optical device wafer along the streets, JP-A 2004-9139 discloses a method in which a groove is formed by applying a pulse laser beam along the streets formed on the wafer, and the wafer is divided along the grooves.

The processing conditions of the laser beam applied to a workpiece can be suitably adjusted depending on the output, wavelength, repetition frequency, focal spot shape, etc. However, it is difficult to suitably change the focal spot shape to a circle or an ellipse whose long axis and short axis differ from each other in length and hence, there arises a problem that the adjustment of the processing conditions is restricted.

SUMMARY OF THE INVENTION

It is an object of the present invention to provide a laser beam processing machine capable of easily changing the focal spot shape of a laser beam to a circle or an ellipse whose long axis and short axis differ from each other in length.

To solve the above main technical problem, according to the present invention, there is provided a laser beam processing machine comprising a chuck table for holding a workpiece and a laser beam application means for applying a laser beam to the workpiece held on the chuck table, the laser beam application means comprising a laser beam oscillation means for oscillating a laser beam and a condenser for converging the laser beam oscillated by the laser beam oscillation means, wherein the condenser comprises a first cylindrical lens unit having a first cylindrical lens, a second cylindrical lens unit having a second cylindrical lens which is positioned such that its converging direction becomes perpendicular to the converging direction of the first cylindrical lens, and an interval adjustment mechanism for adjusting the interval between the first cylindrical lens unit and the second cylindrical lens unit.

The above interval adjustment mechanism comprises a support board, a first support table which is mounted on the support board and holds the first cylindrical lens unit or the second cylindrical lens unit, a second support table which is arranged above the first support table in such a manner that it can move in the vertical direction along the support board, and holds the second cylindrical lens unit or the first cylindrical lens unit, and an adjusting means for adjusting the interval between the first support table and the second support table. The adjusting means comprises a first adjustment plate fixed to the support board, a second adjustment plate which is fixed to the second support table and arranged above the first adjustment plate and an adjusting screw means fitted in the second adjustment plate, and the end of a metering rod which constitutes the adjusting screw means and can move in a vertical direction comes into contact with the top surface of the first adjustment plate.

The above first cylindrical lens unit comprises a lens holding member which is circular and holds the first cylindrical lens, a first frame having a circular hollow for accepting the lens holding member, a second frame for holding the first frame, a turning adjustment means for turning the lens holding member along the inner wall of the circular hollow, and a moving adjustment means for moving the first frame relative to the second frame in a direction perpendicular to the converging direction of the first cylindrical lens; and the above second cylindrical lens unit comprises a lens holding member which is circular and holds the second cylindrical lens, a first frame having a circular hollow for accepting the lens holding member, a second frame for holding the first frame, a turning adjustment means for turning the lens holding member along the inner wall of the circular hollow, and a moving adjustment means for moving the first frame relative to the second frame in a direction perpendicular to the converging direction of the second cylindrical lens.

Since the laser beam processing machine of the present invention comprises the interval adjustment mechanism for adjusting the interval between the first cylindrical lens unit and the second cylindrical lens unit to adjust the interval between the first cylindrical lens unit and the second cylindrical lens unit, a focal spot having a circular section and a focal spot having an elliptic section can be formed, and further, the ratio of the long axis to the short axis of the focal spot having an elliptic section can be suitably changed. Therefore, the shape of a focal spot suitable for laser processing can be suitably selected.

DETAILED DESCRIPTION OF THE PREFERRED EMBODIMENTS

A preferred embodiment of a laser beam processing machine constituted according to the present invention will be described in more detail with reference to the accompanying drawings.

Figure 1:
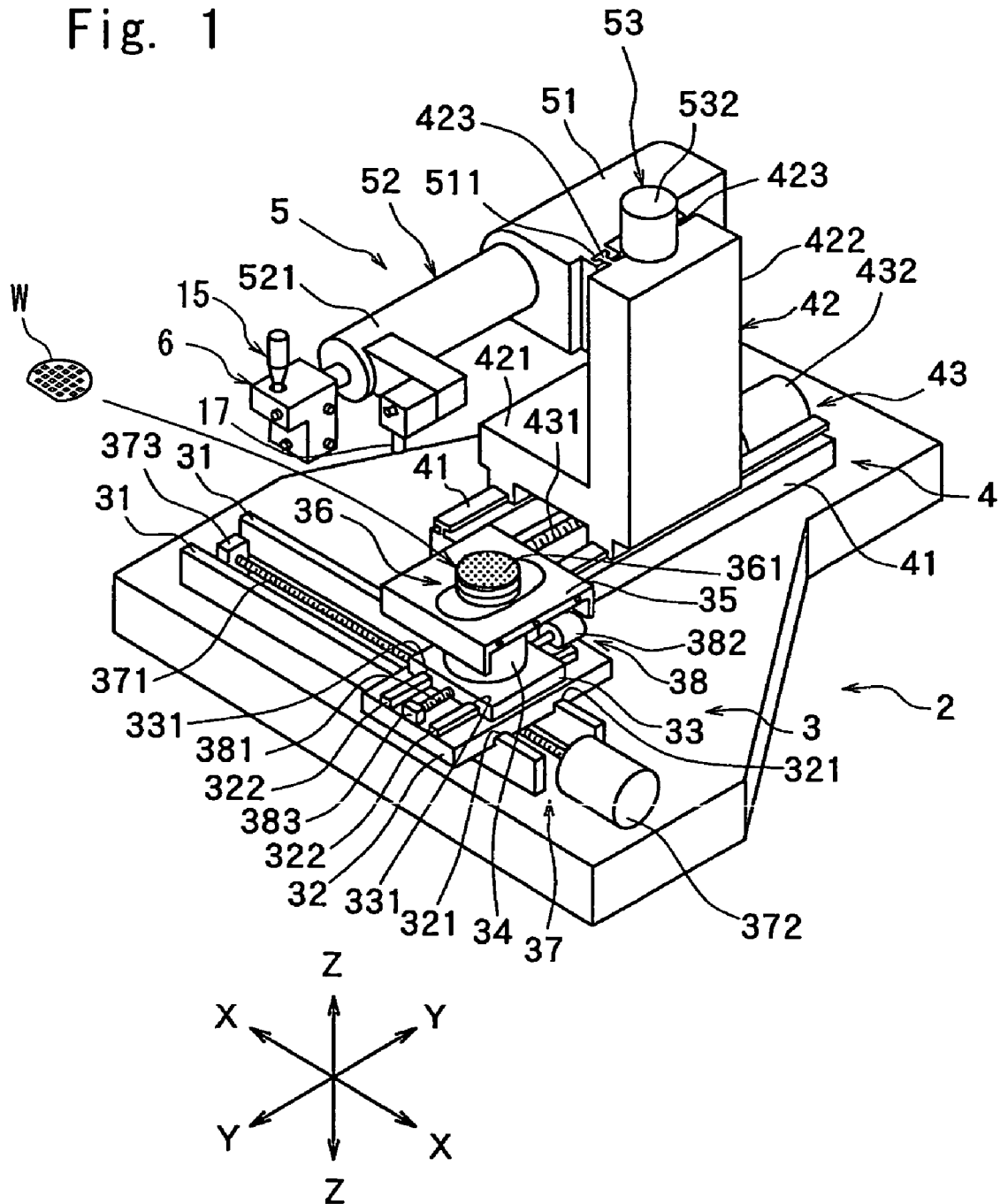
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 for holding a workpiece that is mounted on the stationary base 2 in such a manner that it can move in a processing-feed direction indicated by an arrow X, a laser beam application unit support mechanism 4 that is mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31, which are mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a cover table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer, is held on the adsorption chuck 361 by a suction means that is not shown. The chuck table 36 constituted as described above is rotated by a pulse motor (not shown) installed in the cylindrical member 34.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other along the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 arranged between the above pair of guide rails 31 and 31 parallel thereto and a drive source such as a pulse motor 372 for rotary-driving the male screw rod 371. The male screw rod 371 is, at its one end, rotatably supported to a bearing block 373 fixed onto the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 formed on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 in the indexing-feed direction indicated by the arrow Y along the pair of guide rails 322 and 322 formed on the first sliding block 32. The first indexing-feed means 38 comprises a male screw rod 381 which is arranged between the above pair of guide rails 322 and 322 parallel thereto and a drive source such as a pulse motor 382 for rotary-driving the male screw rod 381. The male screw rod 381 is, at its one end, rotatably supported to a bearing block 383 fixed onto the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 which are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing means 43 for moving the movable support base 42 along the pair of guide rails 41 and 41 in the indexing-feed direction indicated by the arrow Y. This second indexing means 43 comprises a male screw rod 431 arranged between the above pair of guide rails 41 and 41 parallel thereto and a drive source such as a pulse motor 432 for rotary-driving the male screw rod 431. The male screw rod 431 is, at its one end, rotatably supported to a bearing block (not shown) fixed on the above stationary base 2 and is, at the other end, transmission coupled to the output shaft of the above pulse motor 432.

The male screw rod 431 is screwed into a threaded throughhole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 formed on the above mounting portion 422 and is supported in such a manner that it can move in the direction indicated by the arrow Z when the to-be-guided grooves 511 and 511 are fitted to the above guide rails 423 and 423, respectively.

The laser beam application unit 5 in the illustrated embodiment comprises a moving means 53 for moving the unit holder 51 along the pair of guide rails 423 and 423 in the direction indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in the reverse direction.

Figure 2:
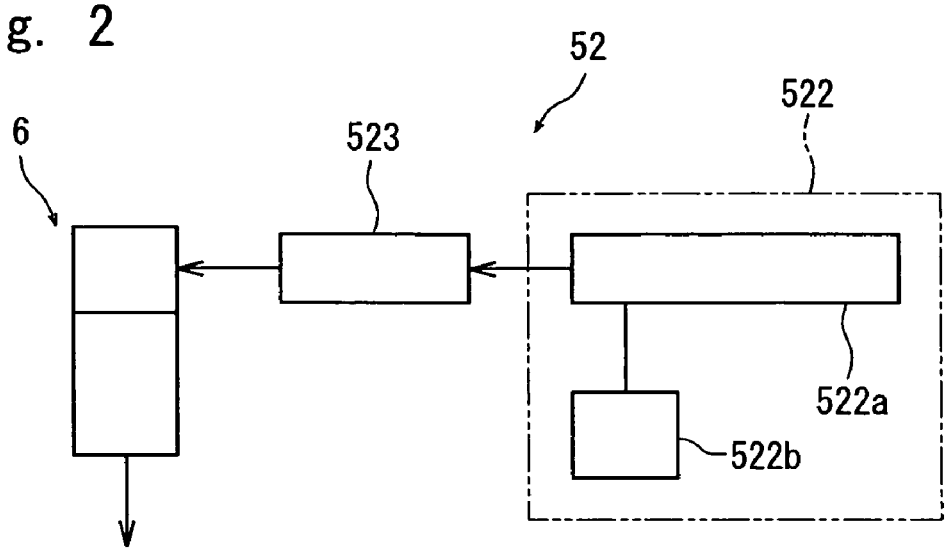
FIG. 2 is a block diagram of a laser beam application means provided in the laser beam processing machine shown in FIG. 1.

The illustrated laser beam application means 52 has a cylindrical casing 521 that is secured to the above unit holder 51 and extends substantially horizontally. The laser beam application means 52 comprises a pulse laser beam oscillation means 522 and a transmission optical system 523 installed in the casing 521 as shown in FIG. 2 and a processing head 6 for applying a pulse laser beam oscillated by the pulse laser beam oscillation means 522 to the workpiece held on the above chuck table, which is attached to the end of the casing 521. The above pulse laser beam oscillation means 522 comprises a pulse laser beam oscillator 522a composed of a YAG laser oscillator or YVO4 laser oscillator and a repetition frequency setting means 522b connected to the pulse laser beam oscillator 522a. The transmission optical system 523 has suitable optical elements such as beam splitter, etc.

Figure 3:
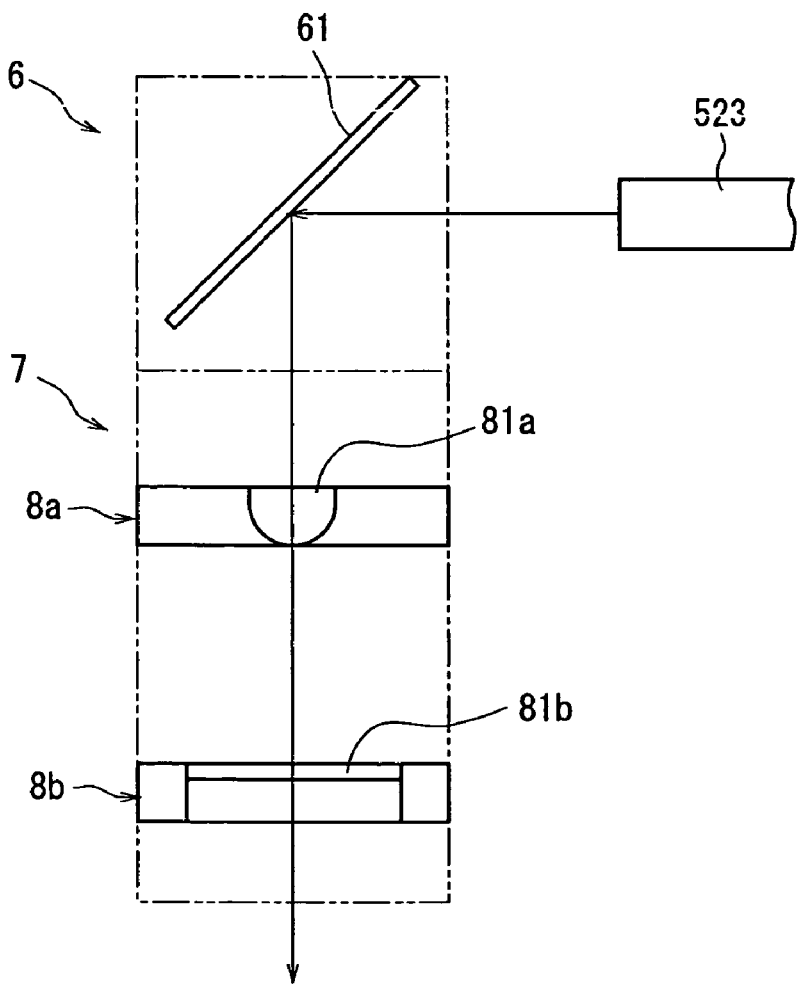
FIG. 3 is an explanatory diagram of a processing head constituting the laser beam application means shown in FIG. 2.
Figure 4:
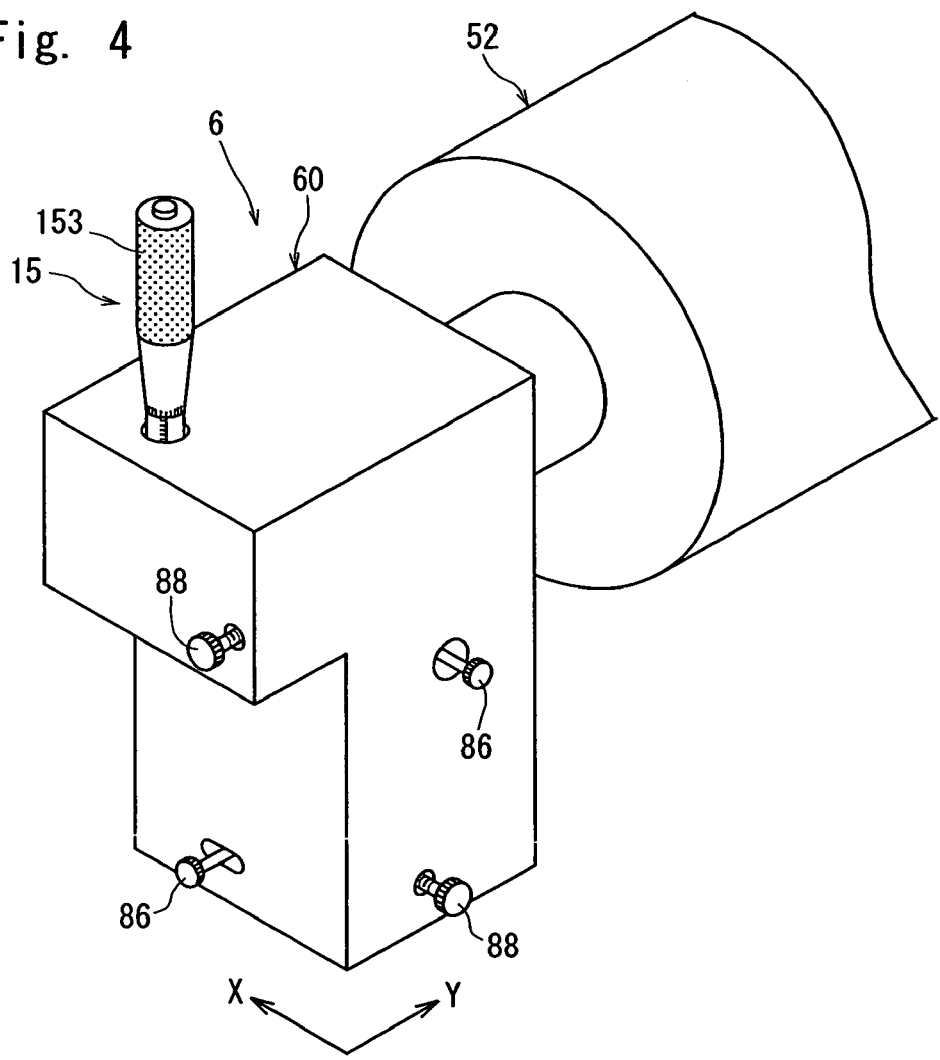
FIG. 4 is a perspective view of the processing head shown in FIG. 3.

The above processing head 6 is composed of a direction changing mirror 61 and a condenser 7, as shown in FIG. 3. The direction changing mirror 61 changes the direction of the pulse laser beam that is oscillated from the above pulse laser beam oscillation means 522 and irradiated through the transmission optical system 523 toward the condenser 7. The condenser 7 in the illustrated embodiment comprises a first cylindrical lens unit 8a having a first cylindrical lens 81a, a second cylindrical lens unit 8b having a second cylindrical lens 81b positioned such that its converging direction becomes perpendicular to that of the first cylindrical lens 81a, and an interval adjustment mechanism for adjusting the interval between the first cylindrical lens unit 8a and the second cylindrical lens unit 8b, which will be described later. The above direction changing mirror 61, the first cylindrical lens unit 8a, the second cylindrical lens unit 8b and the interval adjustment mechanism later described are installed in a processing head housing 60 secured to the end of the above casing 521 as shown in FIG. 4.

Figure 5:
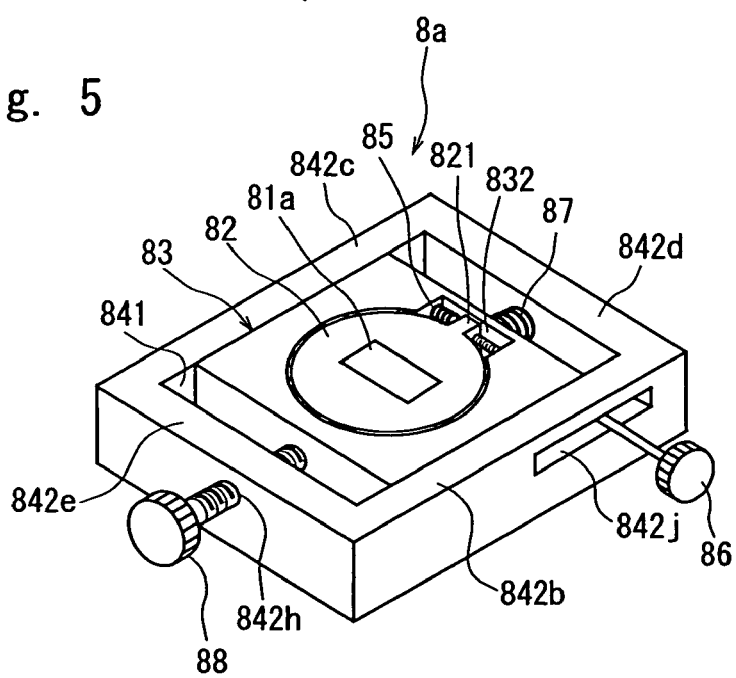
FIG. 5 is a perspective view of a first cylindrical lens unit constituting the condenser of the processing head shown in FIG. 3.

The first cylindrical lens unit 8a will be described with reference to FIGS. 5 to 7. FIG. 5 is a perspective view of the first cylindrical lens unit 8a, and FIG. 6 is an exploded perspective view of the first cylindrical lens unit 8a shown in FIG. 5.

Figure 6:
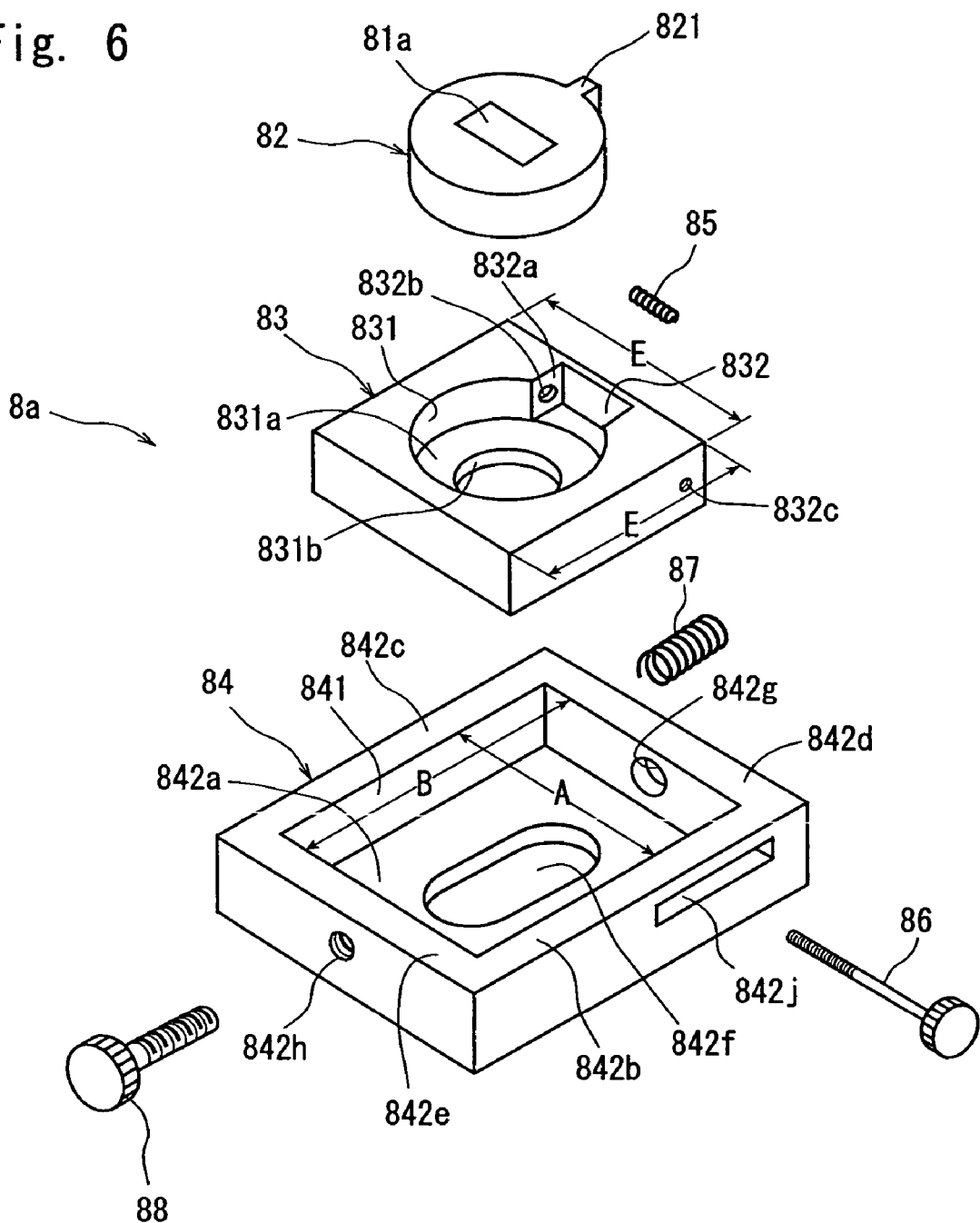
FIG. 6 is an exploded perspective view of the constituent members of the first cylindrical lens unit shown in FIG. 5.

The first cylindrical lens unit 8a shown in FIG. 5 and FIG. 6 comprises the first cylindrical lens 81a, a lens holding member 82 for holding the first cylindrical lens 81a, a first frame 83 for holding the lens holding member 82, and a second frame 84 for holding the first frame 83.

Figure 7:
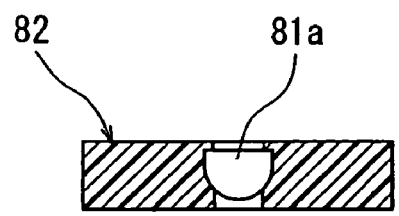
FIG. 7 is a sectional view of a lens holding member holding a first cylindrical lens constituting the first cylindrical lens unit shown in FIG. 5.

The first cylindrical lens 81a has a semicircular section as shown in FIG. 7. The focal distance of this first cylindrical lens 81a is set to 80 mm in the illustrated embodiment. The lens holding member 82 for holding the first cylindrical lens 81a is circular and made of a synthetic resin in the illustrated embodiment. The first cylindrical lens 81a is embedded in the lens holding member 82 made of a synthetic resin in such a manner that its top surface and bottom surface are exposed. A projecting piece 821 is formed from one position of the outer peripheral surface of the lens holding member 82 as shown in FIG. 6.

The above first frame 83 has, as shown in FIG. 6, a shape of square with a side length E, and a circular hollow 831 for accepting the above lens holding member 82 and a working chamber 832 for accepting the projecting piece 821 formed on the lens holding member 82 are formed in the top surface of the first frame 83. A hole 831b is formed in the center portion of the bottom wall 831a of the circular hollow 831. A recess 832b which is a spring seat is formed in the wall surface 832a forming the working chamber 832. A screw hole 832c is formed on the axis line of the recess 832b in the first frame 83. The lens holding member 82 is, as shown in FIG. 5, fitted in the circular hollow 831 of the first frame 83 thus constituted, and the projecting piece 821 is fitted in the working chamber 832. Therefore, the lens holding member 82 fitted in the circular hollow 831 of the first frame 83 can turn along the inner wall of the circular hollow 831 as far as the projecting piece 821 can move within the working chamber 832. A compression coil spring 85 is interposed between the above recess 832b and the projecting piece 821. A first adjustment screw 86 is screwed into the above screw hole 832c, and the end of the first adjustment screw 86 is designed to be brought into contact with the projecting piece 821. Therefore, when the first adjustment screw 86 is moved forward by rotating in one direction, the lens holding member 82 is turned in one direction against the spring force of the compression coil spring 85, and when the first adjustment screw 86 is moved backward by rotating in the other direction, the lens holding member 82 is turned in the other direction by the spring force of the compression coil spring 85. Thus, the projecting piece 821 formed on the lens holding member 82, the first adjustment screw 86 and the compression coil spring 85 function as a turning adjustment means for turning the lens holding member 82 along the inner wall of the circular hollow 831.

The above second frame 84 is rectangular, and a rectangular hollow 841 for accepting the first frame 83 is formed in the top surface of the second frame 84 as shown in FIG. 6. This rectangular hollow 841 has a width A corresponding to the length E of one side of the above square first frame 83 and a length B larger than the length E of one side of the first frame 83. The rectangular hollow 841 is sectioned by a bottom wall 842a and side walls 842b, 842c, 842d and 842e. A hole 842f is formed in the center portion of the bottom wall 842a. A recess 842g which is a spring seat is formed in the inner surface of the side wall 842d sectioning the rectangular hollow 841. A screw hole 842h is formed in the side wall 842e opposite to the side wall 842d having the recess 842g. A prolonged hole 842j for accepting insertion of the first adjustment screw 86 is formed in the side wall 842b of the second frame 84. The above first frame 83 is fitted to the rectangular hollow 841 of the second frame 84 constituted as described above, as shown in FIG. 5. A compression coil spring 87 is interposed between the recess 842g formed in the inner surface of the above side wall 842d and the side wall of the first frame 83. A second adjustment screw 88 is screwed into the screw hole 842h formed in the side wall 842e, and the end of the second adjustment screw 88 is designed to be brought into contact with the side wall of the first frame 83. Therefore, when the second adjustment screw 88 is moved forward by rotating in one direction, the first frame 83 is moved in one direction against the spring force of the compression coil spring 87 and when the second adjustment screw 88 is moved backward by rotating in the other direction, the first frame 83 is moved in the other direction by the spring force of the compression coil spring 87. Thus, the second adjustment screw 88 and the compression coil spring 87 function as a moving adjustment means for moving the first frame 83 relative to the second frame 84 in a direction perpendicular to the converging direction of the first cylindrical lens 81a.

Figure 8:
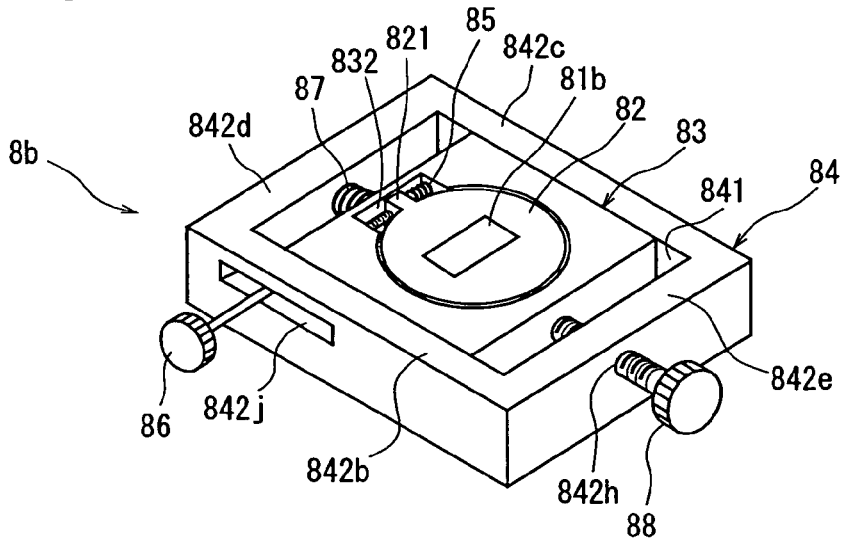
FIG. 8 is a perspective view of a second cylindrical lens unit constituting the condenser of the processing head shown in FIG. 3.

A description is subsequently given of the above second cylindrical lens unit 8b with reference to FIG. 8 and FIG. 9. FIG. 8 is a perspective view of the second cylindrical lens unit 8b and FIG. 9 is an exploded perspective view of the second cylindrical lens unit 8b shown in FIG. 8.

Figure 9:
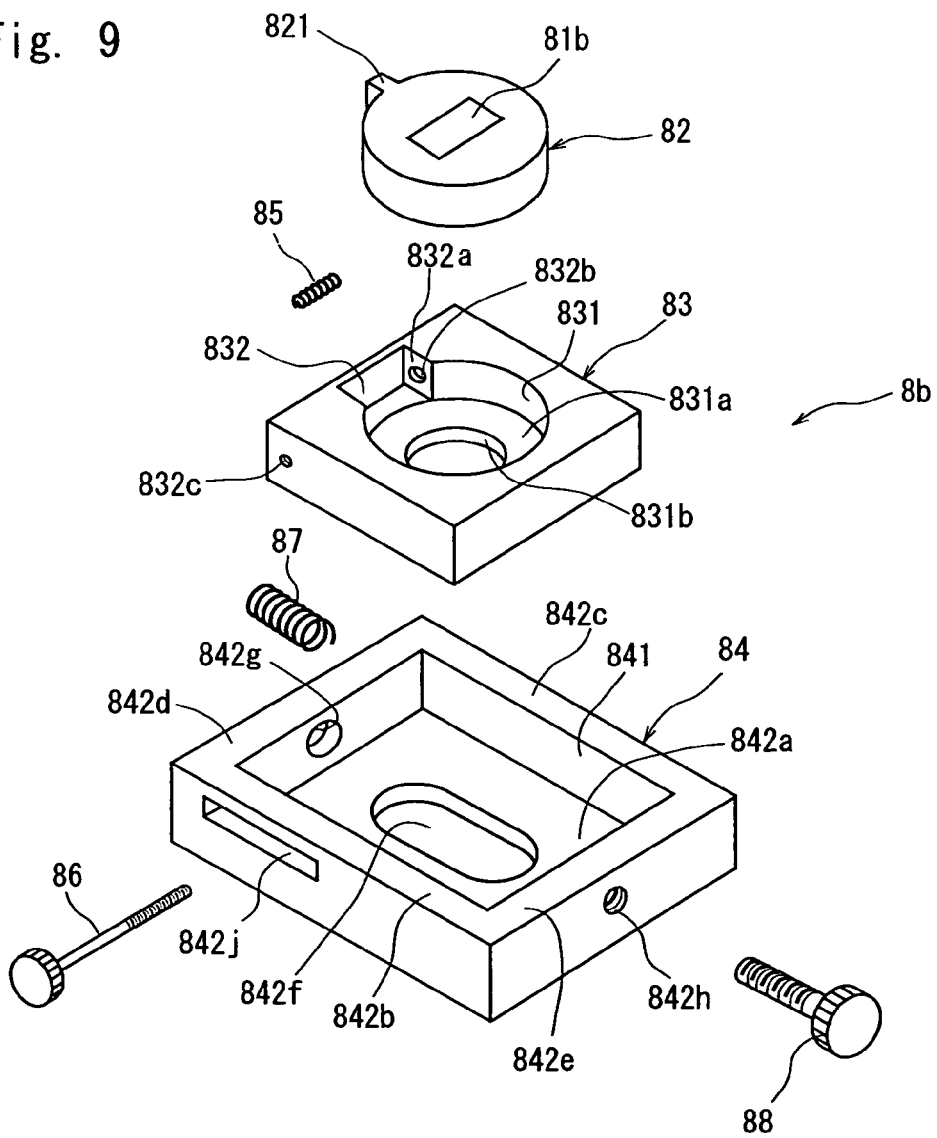
FIG. 9 is an exploded perspective view of the constituent members of the second cylindrical lens unit shown in FIG. 8.

The second cylindrical lens unit 8b shown in FIG. 8 and FIG. 9 comprises the second cylindrical lens 81b, a lens holding member 82 for holding the second cylindrical lens 81b, a first frame 83 for holding the lens holding member 82 and a second frame 84 for holding the first frame 83, like the above first cylindrical lens unit 8a. Since the lens holding member 82, the first frame 83 and the second frame 84 constituting the second cylindrical lens unit 8b are substantially identical to the lens holding member 82, the first frame 83 and the second frame 84 constituting the above first cylindrical lens unit 8a, the same reference symbols are given to the same members and their detailed descriptions are omitted. The second cylindrical lens 81b constituting the second cylindrical lens unit 8b has a focal distance of 40 mm in the illustrated embodiment.

Figure 10:
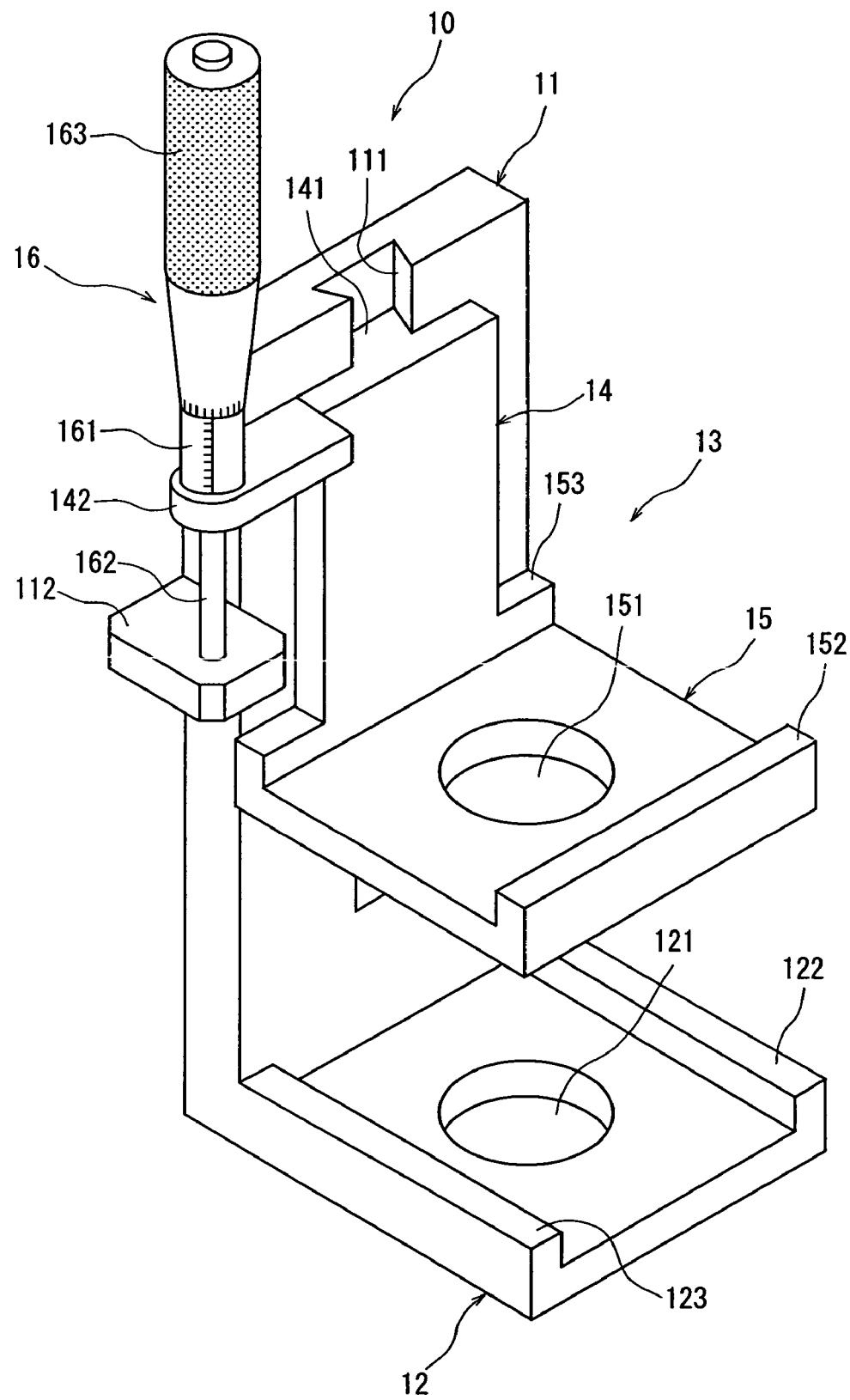
FIG. 10 is a perspective view of an interval adjustment mechanism for adjusting the interval between the first cylindrical lens unit and the second cylindrical lens unit provided in the laser beam processing machine shown in FIG. 1.

The first cylindrical lens unit 8a and the second cylindrical lens unit 8b constituted as described above are set in the interval adjustment mechanism 10 shown in FIG. 10. A description of the interval adjustment mechanism 10 is given below.

The interval adjustment mechanism 10 shown in FIG. 10 comprises a support board 11, a first support table 12 installed at the lower end of the support board 11, and a second support table 13 arranged in such a manner that it can move in the vertical direction along the front surface of the support board 11.

A guide groove 111 is formed in the center portion of the front surface of the support board 11 in the vertical direction. A first adjustment plate 112 is fixed to the intermediate portion of the side wall of the support board 11. The first support table 12 projects from the front surface of the support board 11 at a right angle. A hole 121 is formed in the center portion of this first support table 12. Positioning rails 122 and 123 each extending from the front surface of the support board 11 at a right angle are formed at the both side ends of the first support table 12. The interval between the positioning rails 122 and 123 is set to a size corresponding to the width of the second frame 84 constituting the above second cylindrical lens unit 8b.

The above second support table 13 is composed of a support portion 14 and a table portion 15 installed at the lower end of the support portion 14. The support portion 14 has on the back a to-be-guided rail 141 that is to be fitted to the guide groove 111 formed in the above support board 11. By fitting this to-be-guided rail 141 to the guide groove 111, the second support table 13 is supported to the support board 11 in such a manner that it can move in the vertical direction along the guide groove 111. A second adjustment plate 142 positioned above the first adjustment plate 112 is fixed to the top end of the support portion 14. The above table portion 15 projects from the front surface of the support portion 14 at a right angle. A hole 151 is formed in the center portion of the table portion 15. Positioning rails 152 and 153 each extending parallel to the front surface of the support portion 14 are formed at the front and rear ends of the table portion 15. The interval between the positioning rails 152 and 153 is set to a size corresponding to the width of the second frame 84 constituting the above first cylindrical lens unit 8a.

An adjusting screw means 16 is fitted in the above second adjustment plate 142. This adjusting screw means 16 comprises a support cylinder 161 mounted on the second adjustment plate 142, a metering rod 162 installed in the support cylinder 161 in such a manner that it can move in the vertical direction, and an adjusting dial 163 for moving the metering rod 162 in the vertical direction and has the same structure as a micrometer. In the thus constituted adjusting screw means 16, the end (lower end) of the metering rod 162 comes into contact with the top surface of the first adjustment plate 112 to restrict the position in the vertical direction of the support portion 14 constituting the second support table 13. Therefore, by moving the metering rod 162 in the vertical direction by turning the adjusting dial 163 in one direction or the other direction, the position in the vertical direction of the support portion 14, that is, the interval between the table portion 15 installed at the lower end of the support portion 14 and the first support table 12 can be changed. At this point, the movement of the metering rod 162 is adjusted based on scales on the support cylinder 161 and the adjusting dial 163 to suitably adjust the interval between the table portion 15 of the second support table 13 and the first support table 12.

Figure 11:
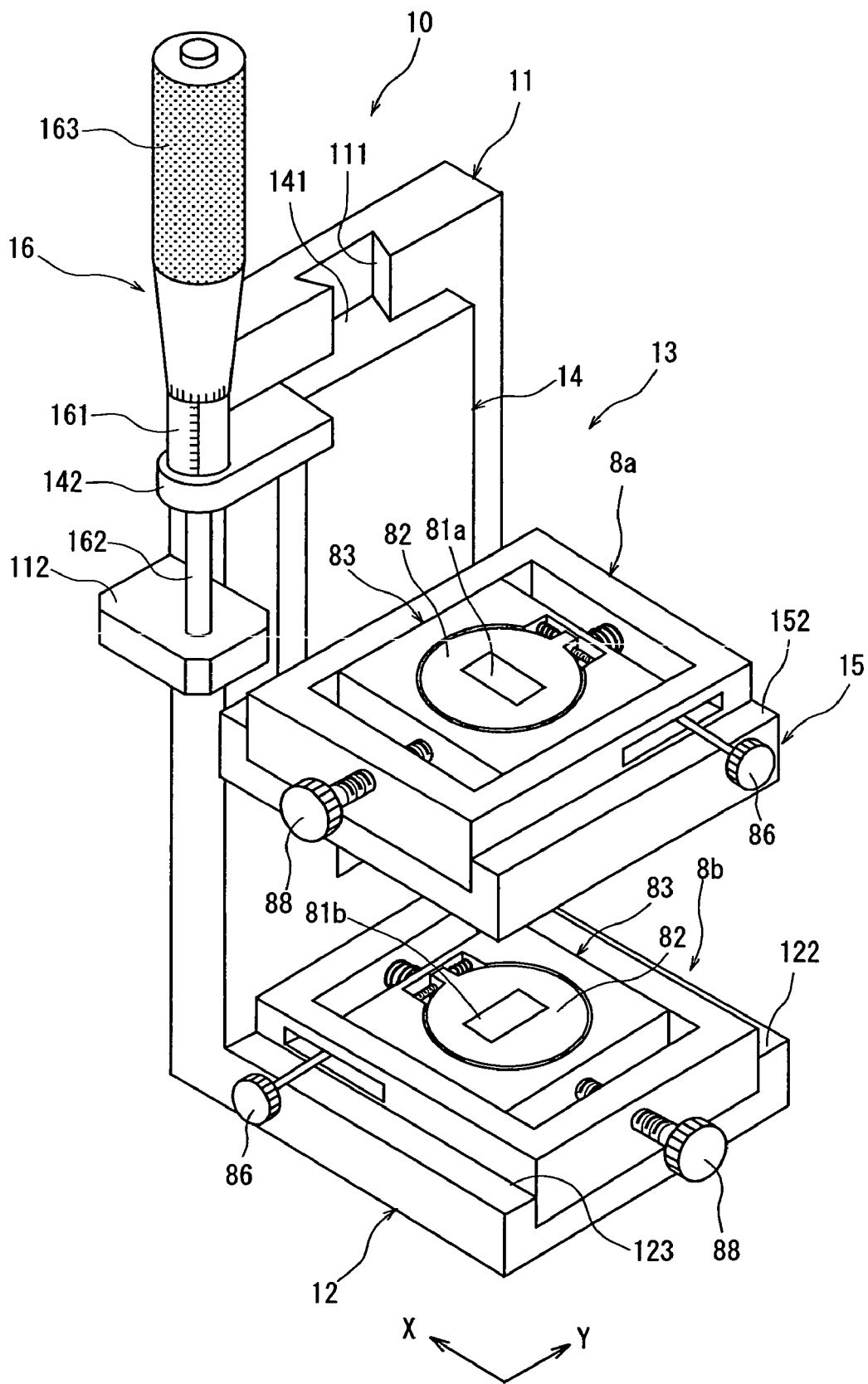
FIG. 11 is a perspective view of the first cylindrical lens unit and the second cylindrical lens unit set in the interval adjustment mechanism shown in FIG. 10.

The above second cylindrical lens unit 8b is set on the first support table 12 of the interval adjustment mechanism 10 constituted as described above, as shown in FIG. 11. That is, the second frame 84 of the second cylindrical lens unit 8b is placed between the positioning rails 122 and 123 of the first support table 12. The second cylindrical lens unit 8b placed at a predetermined position on the first support table 12 is fixed on the first support table 12 by a suitable fixing means that is not shown. The converging direction of the second cylindrical lens 81b of the second cylindrical lens unit 8b placed on the first support table 12 is set to the direction indicated by the arrow X in FIG. 11.

The above first cylindrical lens unit 8a is set on the table portion 15 of the second support table 13 of the interval adjustment mechanism 10. That is, the second frame 84 of the first cylindrical lens unit 8a is placed between the positioning rails 152 and 153 of the table portion 15 constituting the second support table 13. The first cylindrical lens unit 8a placed at a predetermined position on the table portion 15 of the second support table 13 is fixed onto the table portion 15 of the second support table 13 by a suitable fixing means that is not shown. The converging direction of the first cylindrical lens 81a of the first cylindrical lens unit 8a placed on the table portion 15 of the second support table 13 is set to the direction indicated by the arrow Y in FIG. 11.

Returning to FIG. 1, an image pick-up means 17 for detecting the area to be processed by the above laser beam application means 52 is attached to the front end portion of the casing 521 constituting the above laser beam application means 52. This image pick-up means 17 is constituted by an image pick-up device (CCD) and supplies an image signal to a control means that is not shown.

The laser beam processing machine in the illustrated embodiment is constituted as described above, and its function will be described hereinunder.

The focal spot shape of a laser beam irradiated by the above-described laser beam application means 52 will be first described with reference to FIGS. 12(a) to 12(c) and FIGS. 13(a) to 13(c).

Figure 12:
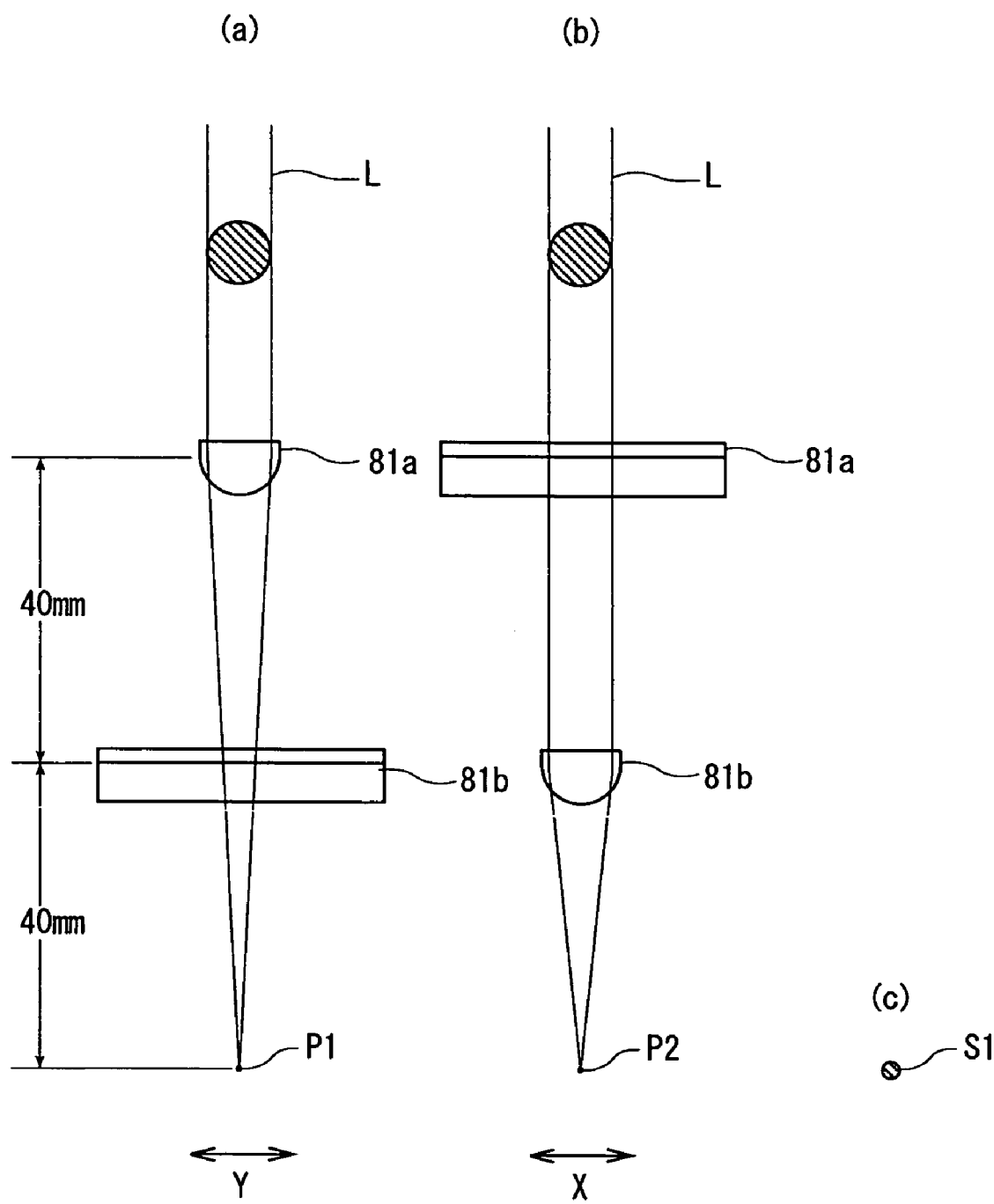
FIGS. 12(a) to 12(c) are explanatory diagrams showing a state of a focal spot having a circular section being formed by the first cylindrical lens and the second cylindrical lens.

When the interval between the first cylindrical lens 81a and the second cylindrical lens 81b is set to 40 mm as shown in FIGS. 12(a) and 12(b), as the focal distance of the first cylindrical lens 81a is set to 80 mm in the illustrated embodiment, the focal point P1 of a laser beam L converged by the first cylindrical lens 81a is at a position 40 mm below the second cylindrical lens unit 8b as shown in FIG. 12(a). Meanwhile, as the focal distance of the second cylindrical lens 81b is set to 40 mm in the illustrated embodiment, the focal point P2 of the laser beam L converged by the second cylindrical lens 81b is at a position 40 mm below the second cylindrical lens unit 8b as shown in FIG. 12(b). The focal point P1 and the focal point P2 are thus in the same position. As a result, the laser beam L having a circular section applied to the first cylindrical lens 81a is converged in the direction indicated by the arrow Y by the first cylindrical lens 81a and in the direction indicated by the arrow X by the second cylindrical lens 81b, thereby forming a focal spot S1 having a circular section at the focal points P1 and P2 as shown in the enlarged view of FIG. 12(c). Therefore, when the workpiece is set at the focal points P1 and P2, the workpiece can be processed by means of the focal spot S1 having a circular section.

Figure 13:
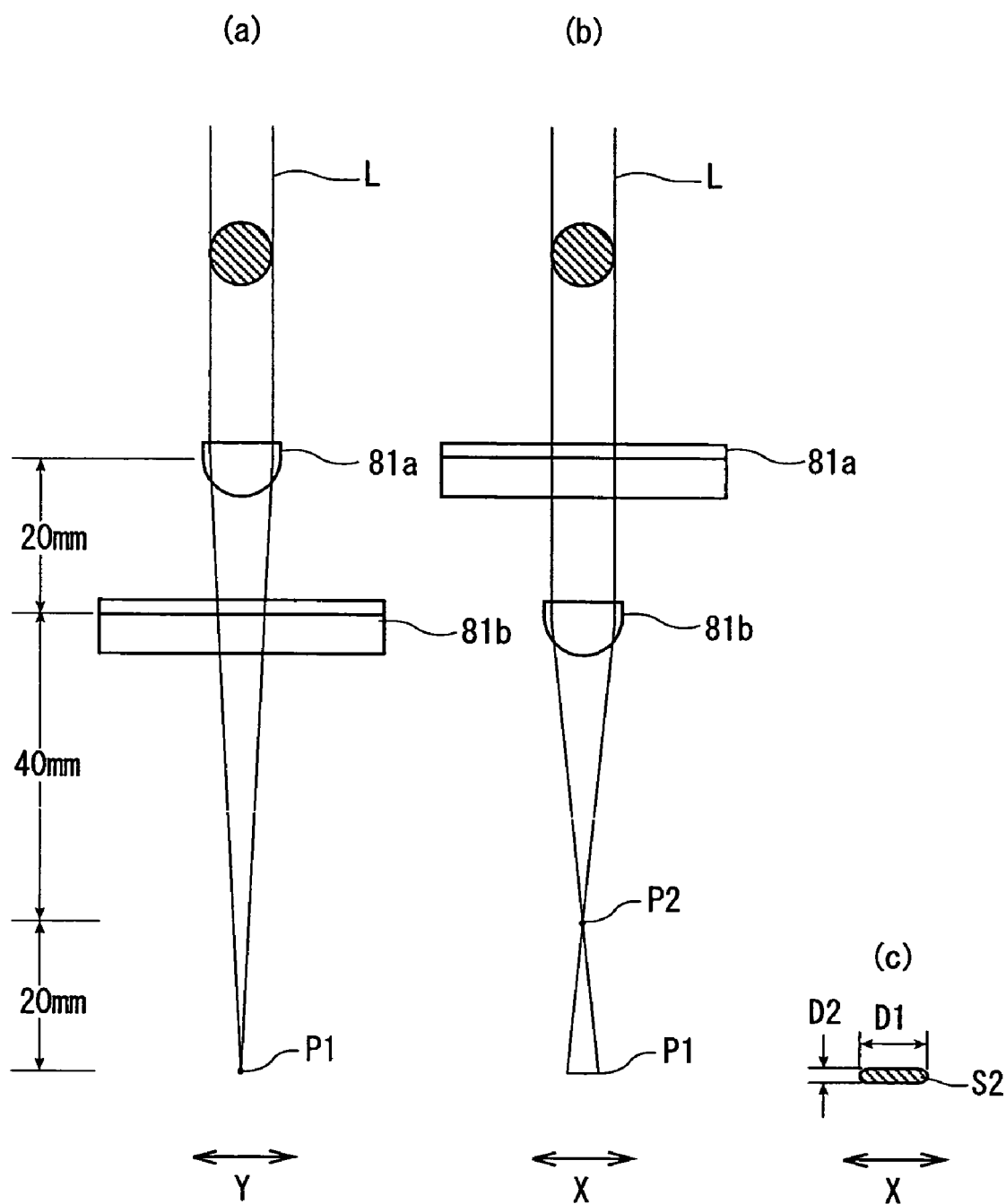
FIGS. 13(a) to 13(c) are explanatory diagrams showing a state of a focal spot having an elliptic section being formed by the first cylindrical lens and the second cylindrical lens.

Next, when the interval between the first cylindrical lens 81a and the second cylindrical lens 81b is set to 20 mm as shown in FIGS. 13(a) and 13(b), as the focal distance of the first cylindrical lens 81a is set to 80 mm, the focal point P1 of the laser beam L converged by the first cylindrical lens 81a is at a position 60 mm below the second cylindrical lens unit 8b as shown in FIG. 13(a). Meanwhile, as the focal distance of the second cylindrical lens 81b is set to 40 mm, the focal point P2 of the laser beam L converged by the second cylindrical lens 81b is at a position 40 mm below the second cylindrical lens unit 8b as shown in FIG. 13(b). Therefore, the laser beam L to be converged by the second cylindrical lens 81b is converged at the focal point P2 and is expanded in the direction indicated by the arrow X until it reaches the above focal point P1. As a result, at the position of the focal point P1, a focal spot S2 having an elliptic section is formed as shown in the enlarged view of FIG. 13(c). The long axis D1 of the elliptic focal spot S2 is formed in the direction indicated by the arrow X. The ratio of the long axis D1 to the short axis D2 of the focal spot S2 having an elliptic section can be adjusted by changing the interval between the first cylindrical lens 81a and the second cylindrical lens 81b. Therefore, when the workpiece is set at the position of the focal point P1, the workpiece can be processed by means of the focal spot S2 having an elliptic section.

Figure 14:
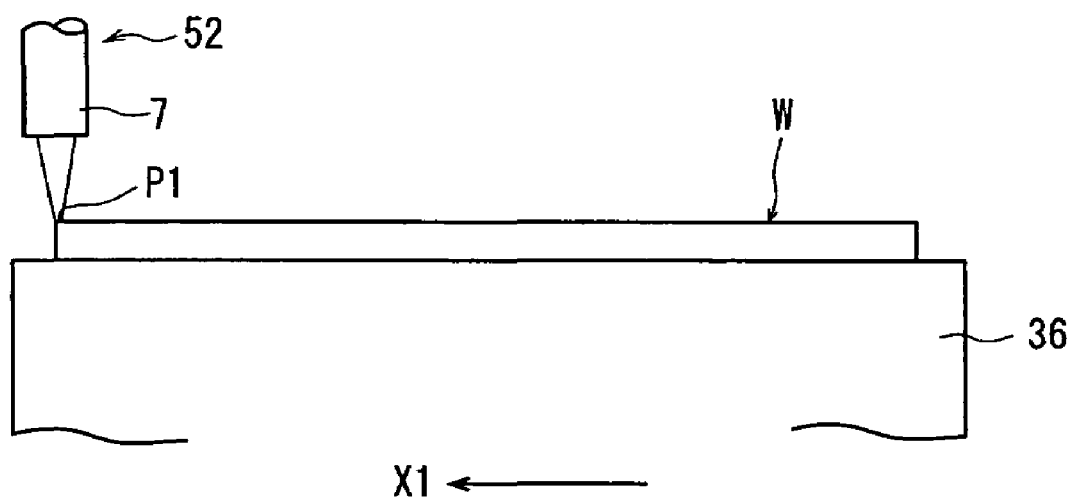
FIGS. 14(a) and 14(b) are explanatory diagrams showing a groove forming step which is carried out by the laser beam processing machine shown in FIG. 1.
Figure 14:
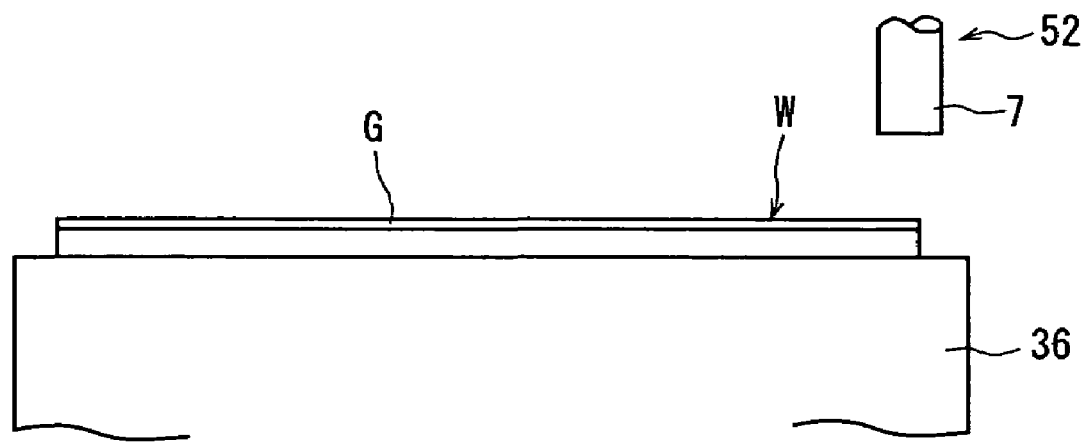

A description is subsequently given of a processing method for forming a groove in the workpiece by means of the focal spot S2 having an elliptic section shown in FIGS. 13(a) to 13(c) with reference to FIG. 1 and FIG. 14.

A semiconductor wafer W as the workpiece is first placed on the chuck table 36 of the laser beam processing machine shown in FIG. 1. The semiconductor wafer W is suction-held on the chuck table 36 by activating a suction means that is not shown. Streets are formed in a lattice pattern on the front surface of the semiconductor wafer W and a device such as IC or LSI is formed in a plurality of areas sectioned by the lattice pattern-like streets. The chuck table 36 suction-holding the semiconductor wafer W is brought to a position right below the image pick-up means 17 by the processing-feed means 37. After the chuck table 36 is positioned right below the image pick-up means 17, alignment work for detecting the area to be processed of the semiconductor wafer W is carried out by the image pick-up means 17 and the control means that is not shown. That is, the image pick-up means 17 and the control means (not shown) carry out image processing such as pattern matching, etc. to align a street formed in a predetermined direction of the semiconductor wafer W with the condenser 7 of the laser beam application means 52 for applying a laser beam along the street, thereby performing the alignment of a laser beam application position. The alignment of the laser beam application position is also carried out on streets formed on the semiconductor wafer W in a direction perpendicular to the above predetermined direction.

After the alignment of the laser beam application position is carried out by detecting the street formed on the semiconductor wafer W held on the chuck table 36 as described above, as shown in FIG. 14(a), the chuck table 36 is moved to a laser beam application area where the condenser 7 of the laser beam application means 52 is located so as to bring one end (left end in FIG. 14(a)) of the predetermined street to a position right below the condenser 7. The long axis D1 shown in FIG. 13(c) of the focal spot S2 having an elliptic section of the laser beam irradiated from the condenser 7 is aligned with the street. The focal point P1 of the pulse laser beam applied from the condenser 7 is set to a position near the front surface (top surface) of the semiconductor wafer W. The moving means 53 for moving the laser beam application means 52 in the direction indicated by the arrow Z along the guide rails 423 and 423 is used to set the focal point P1 to a position near the front surface (top surface) of the semiconductor wafer. The chuck table 36, that is, the semiconductor wafer W is then moved in the direction indicated by the arrow X1 in FIG. 14(a) at a predetermined processing-feed rate while a pulse laser beam of a wavelength having absorptivity for the semiconductor wafer W is applied from the condenser 7 of the laser beam application means 52. When the other end (right end in FIG. 14(b)) of the street reaches a position right below the condenser 7, the application of the pulse laser beam is suspended, and the movement of the chuck table 36, that is, the semiconductor wafer W is stopped. As a result, a groove G is formed along the street in the semiconductor wafer W as shown in FIG. 14(b) (groove forming step).

The above groove forming step is carried out under the following processing conditions, for example.

Light source of laser beam: YVO4 laser or YAG laser
Wavelength: 355 nm
Repetition frequency: 50 kHz
Average output: 4 W
Focal spot: elliptic, long axis (D1) of 200 μm, short axis (D2) of 10 μm
Processing-feed rate: 150 mm/sec To form a hole such as a via hole in the workpiece such as the semiconductor wafer W by using the focal spot S1 having a circular section shown in FIG. 12(c), the via hole-forming position of the semiconductor wafer W held on the chuck table 36 is brought to a position right below the condenser 7. The focal points P1 and P2 of the pulse laser beam irradiated from the condenser 7 are set to a position near the front surface (top surface) of the semiconductor wafer W. The moving means 53 for moving the laser beam application means 52 along the guide rails 423 and 423 in the direction indicated by the arrow Z is used to set the focal points P1 and P2 to a position near the front surface (top surface) of the semiconductor wafer W. Then, a predetermined number of pulses of the pulse laser beam of a wavelength having absorptivity for the semiconductor wafer W are applied from the condenser 7 of the laser beam application mans 52 to form a hole such as a via hole at a predetermined position of the semiconductor wafer W.

As described above, since the laser beam processing machine of the present invention comprises the interval adjustment mechanism 10 for adjusting the interval between the first cylindrical lens unit 8a and the second cylindrical lens unit 8b to adjust the interval between the first cylindrical lens unit 8a and the second cylindrical lens unit 8b, the focal spot S1 having a circular section and the focal spot S2 having an elliptic section can be formed, and the ratio of the long axis D1 to the short axis D2 of the focal spot S2 having an elliptic section can be suitably changed. Therefore, the shape of the focal spot suitable for application of laser processing can be suitably selected. The length of the short axis D2 of the focal spot S2 having an elliptic section can be changed by suitably changing the lens holding member for holding the cylindrical lens having a different focal distance and holding it in the first frame.

What is claimed is:

1. A laser beam machine with a cylindrical lens system comprising:
   a chuck table for holding a workpiece;
   a laser beam application means for applying a laser beam to the workpiece held on the chuck table, said laser beam application means including a laser beam oscillation means for oscillating a laser beam, and a condenser for converging the laser beam oscillated by the laser beam oscillation means;
   said condenser including a first cylindrical lens unit having a first cylindrical lens, a second cylindrical lens unit disposed at an interval from the first cylindrical lens unit and having a second cylindrical lens which has a converging direction perpendicular to that of the first cylindrical lens, and an interval adjustment mechanism for adjusting the interval between the first and second cylindrical lens units;
   said interval adjustment mechanism including a support board, a first support table mounted on the support board and holding one of the first and second cylindrical lens units, a second support table mounted slidably on the support board at an interval from the first support table and holding the other of the first and second cylindrical lens units, said second support table being movable along the support board toward and away from the first support table, and a control means for adjusting the interval between the first and second support tables; and
   said control means including a first adjustment plate fixed to the support board, a second adjustment plate fixed to the second support table and disposed at a distance from the first adjustment plate and an adjusting screw means fitted in the second adjustment plate, said adjusting screw means including a metering rod having an end in contact with the first adjustment plate, whereby when the adjusting screw means is turned, the second support table is adjustably moved toward and away from the first adjustment plate.

2. The laser beam machine with the cylindrical lens system according to claim 1,
   wherein the first cylindrical lens unit comprises:
   a circular, first lens holding member holding the first cylindrical lens, a first frame having a circular hollow for accommodating the first lens holding member, a second frame for holding the first frame, a first turning adjustment means for turning the first lens holding member along an inner wall of the circular hollow, and a first moving adjustment means for moving the first frame relative to the second frame in a direction perpendicular to the converging direction of the first cylindrical lens; and
   wherein the second cylindrical lens unit comprises:
   a circular, second lens holding member holding the second cylindrical lens, a third frame having a circular hollow for accommodating the second lens holding member, a fourth frame for holding the third frame, a second turning adjustment means for turning the second lens holding member along an inner wall of the circular hollow of the third frame, and a second moving adjustment means for moving the third frame relative to the fourth frame in a direction perpendicular to the converging direction of the second cylindrical lens.

3. The laser beam machine with the cylindrical lens system according to claim 1,
   wherein said circular hollow of the first frame has a first working chamber extending radially outwardly from the circular hollow, and said first lens holding member is formed with a first projecting piece protruding radially outwardly therefrom into the first working chamber; and
   wherein the first working chamber is of a size permitting the first projecting piece to move within the first working chamber when the first lens holding member is turned by the first turning adjustment means, and the first turning adjustment means includes a screw screwed through the first frame and projecting into the first working chamber to act on the first projecting piece so as to turn the first lens holding member.

4. The laser beam machine with the cylindrical lens system according to claim 1,
   wherein said circular hollow of the second frame has a second working chamber extending radially outwardly from the circular hollow of the second frame, and said second lens holding member is formed with a second projecting piece protruding radially outwardly therefrom into the second working chamber; and
   wherein the second working chamber is of a size permitting the second projecting piece to move within the second working chamber when the second lens holding member is turned by the second turning adjustment means, and the second turning adjustment means includes a screw screwed through the second frame and projecting into the second working chamber to act on the second projecting piece so as to turn the second lens holding member.

5. The laser beam machine with the cylindrical lens system according to claim 1,
   wherein the first frame has a square shape and the second frame has a rectangular shape; and
   wherein the second frame has a rectangular hollow with longer sides, accommodating the square first frame slidably therein along the longer sides, and the first moving adjustment means includes a first screw screwed through the second frame to act on the first frame.

6. The laser beam machine with the cylindrical lens system according to claim 1,
   wherein the third frame has a square shape and the fourth frame has a rectangular shape; and wherein the fourth frame has a rectangular hollow with longer sides, accommodating the square third frame slidably therein along the longer sides, and the second moving adjustment means includes a second screw screwed through the fourth frame to act on the third frame.

7. A laser beam machine with a cylindrical lens system comprising:

a chuck table for holding a workpiece;

a laser beam application means for applying a laser beam to the workpiece held on the chuck table, said laser beam application means including a laser beam oscillation means for oscillating a laser beam, and a condenser for converging the laser beam oscillated by the laser beam oscillation means;

said condenser including a first cylindrical lens unit having a first cylindrical lens, a second cylindrical lens unit disposed at an interval from the first cylindrical lens unit and having a second cylindrical lens which has a converging direction perpendicular to that of the first cylindrical lens, and an interval adjustment mechanism for adjusting the interval between the first and second cylindrical lens units; and said interval adjustment mechanism including a support member, a first support table mounted on the support member and holding one of the first and second cylindrical lens units, a second support table mounted slidably on the support member at an interval from the first support table and holding the other of the first and second cylindrical lens units, said second support table being movable along the support member toward and away from the first support table, and a control means for adjusting the interval between the first and second support tables;

wherein the first cylindrical lens unit comprises:

a circular, first lens holding member holding the first cylindrical lens, a first frame having a circular hollow for accommodating the first lens holding member, a second frame for holding the first frame, a first turning adjustment means for turning the first lens holding member along an inner wall of the circular hollow, and a first moving adjustment means for moving the first frame relative to the second frame in a direction perpendicular to the converging direction of the first cylindrical lens; and wherein the second cylindrical lens unit comprises:

a circular, second lens holding member holding the second cylindrical lens, a third frame having a circular hollow for accommodating the second lens holding member, a fourth frame for holding the third frame, a second turning adjustment means for turning the second lens holding member along an inner wall of the circular hollow of the third frame, and a second moving adjustment means for moving the third frame relative to the fourth frame in a direction perpendicular to the converging direction of the second cylindrical lens.

8. The laser beam machine with the cylindrical lens system according to claim 7, wherein said circular hollow of the first frame has a first working chamber extending radially outwardly from the circular hollow, and said first lens holding member is formed with a first projecting piece protruding radially outwardly therefrom into the first working chamber; and wherein the first working chamber is of a size permitting the first projecting piece to move within the first working chamber when the first lens holding member is turned by the first turning adjustment means, and the first turning adjustment means includes a screw screwed through the first frame and projecting into the first working chamber to act on the first projecting piece so as to turn the first lens holding member.

9. The laser beam machine with the cylindrical lens system according to claim 7, wherein said circular hollow of the second frame has a second working chamber extending radially outwardly from the circular hollow of the second frame, and said second lens holding member is formed with a second projecting piece protruding radially outwardly therefrom into the second working chamber; and wherein the second working chamber is of a size permitting the second projecting piece to move within the second working chamber when the second lens holding member is turned by the second turning adjustment means, and the second turning adjustment means includes a screw screwed through the second frame and projecting into the second working chamber to act on the second projecting piece so as to turn the second lens holding member.

10. The laser beam machine with the cylindrical lens system according to claim 7, wherein the first frame has a square shape and the second frame has a rectangular shape; and wherein the second frame has a rectangular hollow with longer sides, accommodating the square first frame slidably therein along the longer sides, and the first moving adjustment means includes a first screw screwed through the second frame to act on the first frame.

11. The laser beam machine with the cylindrical lens system according to claim 7, wherein the third frame has a square shape and the fourth frame has a rectangular shape; and wherein the fourth frame has a rectangular hollow with longer sides, accommodating the square third frame slidably therein along the longer sides, and the second moving adjustment means includes a second screw screwed through the fourth frame to act on the third frame.

* * * * *